US012713739B2

(12) United States Patent
Lee et al.

(10) Patent No.: US 12,713,739 B2
(45) Date of Patent: Aug. 18, 2026

(54) MICRO LED PACKAGE AND DISPLAY MODULE COMPRISING SAME

(71) Applicant: SAMSUNG ELECTRONICS CO., LTD., Suwon-si (KR)

(72) Inventors: Hyungjin Lee, Suwon-si (KR); Jinhee Kang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 493 days.

(21) Appl. No.: 18/115,460

(22) Filed: Feb. 28, 2023

(65) Prior Publication Data

US 2023/0207743 A1 Jun. 29, 2023

Related U.S. Application Data

(63) Continuation of application No. PCT/KR2021/009029, filed on Jul. 14, 2021.

(30) Foreign Application Priority Data

Aug. 28, 2020 (KR) ........................ 10-2020-0109637

(51) Int. Cl.
*H10H 20/85* (2025.01)
*H10H 20/857* (2025.01)
(Continued)

(52) U.S. Cl.
CPC ...... *H10H 20/8506* (2025.01); *H10H 20/857* (2025.01); *H10W 74/10* (2026.01); *H10W 90/00* (2026.01)

(58) Field of Classification Search
CPC ............. H10H 20/8506; H10H 20/857; H10H 20/853; H01L 23/31; H01L 25/167; H10W 74/10
See application file for complete search history.

(56) References Cited

U.S. PATENT DOCUMENTS 6,870,186 B2 * 3/2005 Park .................... H10K 59/1275 257/E39.007
7,012,366 B2 * 3/2006 Park .................... H10K 59/1275 313/505

(Continued)

FOREIGN PATENT DOCUMENTS

CN 101297606 A 10/2008
CN 109244064 A 1/2019

(Continued)

OTHER PUBLICATIONS

International Search Report (PCT/ISA/210) issued by the International Searching Authority on Nov. 1, 2021 in corresponding International Application No. PCT/KR2021/009029.

(Continued)

*Primary Examiner* — Joseph C. Nicely
(74) *Attorney, Agent, or Firm* — Sughrue Mion, PLLC

(57) ABSTRACT

A light-emitting diode package includes a transparent layer; a plurality of light-emitting diodes disposed on a surface of the transparent layer, wherein each of the plurality of light-emitting diodes comprise a light-emitting surface that faces the transparent layer; a spacer disposed on the surface of the transparent layer; a protection member configured to cover the plurality of light-emitting diodes; and a plurality of light-emitting diode electrode pads comprising an electrode pad on each of the plurality of light-emitting diodes; wherein a first height from the surface of the transparent layer to an upper end of the spacer is larger than a second height from the surface of the transparent layer to the plurality of light-emitting diode electrode pads.

19 Claims, 11 Drawing Sheets

(51) Int. Cl.
*H10W 74/10* (2026.01)
*H10W 90/00* (2026.01)

(56) References Cited

U.S. PATENT DOCUMENTS 7,224,115 B2 * 5/2007 Sato ................. H10K 59/80522 428/917
7,649,311 B2 * 1/2010 Park ..................... H10K 59/127 313/506
7,745,992 B2 * 6/2010 Ko ..................... H10K 59/8792 313/506
7,965,034 B2 * 6/2011 Chae .................. H10K 59/1275 313/506
8,044,415 B2 10/2011 Messere et al.
8,581,273 B2 * 11/2013 Takei ................... H10K 59/121 257/89
9,620,487 B2 * 4/2017 Sakariya .............. H10H 20/857
9,887,184 B2 2/2018 Takeya et al.
10,256,218 B2 4/2019 Kim et al.
10,290,787 B2 5/2019 Matsuda et al.
10,312,225 B2 6/2019 Takeya et al.
10,468,394 B1 * 11/2019 Xi ...................... H10K 59/1275
10,516,081 B1 * 12/2019 Xin ...................... H10H 20/821
10,797,027 B2 10/2020 Takeya et al.
10,833,057 B2 11/2020 Takeya et al.
11,244,932 B2 2/2022 Kwag et al.
11,417,640 B2 8/2022 Takeya et al.
2007/0092981 A1 * 4/2007 Jung ...................... H10K 50/81 438/30
2007/0148333 A1 * 6/2007 Morimoto ............ H10K 71/135 427/66
2009/0015136 A1 * 1/2009 Lee .................... H10K 59/8722 313/503
2009/0284144 A1 * 11/2009 Fujioka ................ H10K 59/122 313/504
2015/0132873 A1 5/2015 Rogers et al.
2015/0249069 A1 * 9/2015 Yoshida .............. H01L 25/0753 257/89
2015/0295140 A1 * 10/2015 Aoyagi .............. H10H 20/8506 438/66
2017/0025399 A1 1/2017 Takeya et al.
2017/0069611 A1 3/2017 Zhang et al.
2017/0358624 A1 12/2017 Takeya et al.
2018/0138162 A1 5/2018 Takeya et al.
2018/0175268 A1 6/2018 Moon et al.
2019/0019780 A1 1/2019 Kim et al.
2019/0056543 A1 * 2/2019 Ueda ...................... G02B 5/201
2019/0206851 A1 7/2019 Takeya et al.
2019/0229097 A1 7/2019 Takeya et al.
2020/0044127 A1 * 2/2020 Ahn ..................... H10H 20/857
2020/0135971 A1 4/2020 Beak et al.
2020/0144231 A1 5/2020 Kwag et al.
2020/0328198 A1 10/2020 Takeya et al.
2020/0365650 A1 * 11/2020 Pei ....................... H10H 20/855
2021/0193790 A1 * 6/2021 Hu ......................... H10K 59/18
2022/0029059 A1 * 1/2022 Kishimoto ............ H01L 25/167
2022/0093579 A1 * 3/2022 Kishimoto ........... H10H 20/018
2022/0093834 A1 * 3/2022 Lin ...................... H10H 20/856
2022/0139889 A1 5/2022 Kwag et al.
2022/0157797 A1 5/2022 Takeya et al.

FOREIGN PATENT DOCUMENTS

CN 110010636 A 7/2019
CN 111063691 A 4/2020
EP 3 506 353 A2 7/2019
JP 2019-179111 A 10/2019
KR 10-2008-0088884 A 10/2008
KR 10-2012-0090190 A 8/2012
KR 10-2013-0117622 A 10/2013
KR 10-2014-0136616 A 12/2014
KR 10-2018-0022683 A 3/2018
KR 10-2019-0006892 A 1/2019
KR 10-2050866 B1 12/2019
KR 10-2020-0049394 A 5/2020
KR 10-2020-0052044 A 5/2020
KR 10-2118179 B1 6/2020
WO 2020/157811 A1 8/2020

OTHER PUBLICATIONS

Communication dated Nov. 7, 2024, issued by the Korean Intellectual Property Office in Korean Patent Application No. 10-2020-0109637.

Extended European Search Report dated Oct. 20, 2023, issued by European Patent Office in European Patent Application No. 21861879.1.

Communication issued May 15, 2026 by the China National Intellectual Property Administration in counterpart Chinese Patent Application No. 202180056079.8.

* cited by examiner

MICRO LED PACKAGE AND DISPLAY MODULE COMPRISING SAME

CROSS-REFERENCE TO RELATED APPLICATIONS

This application is a continuation of International Application PCT/KR2021/009029, filed on Jul. 14, 2021, the disclosure of which is incorporated by reference herein in its entirety. International Application PCT/KR2021/009029 claims priority to Korean Patent Application No. 10-2020-0109637, filed on Aug. 28, 2020, in the Korean Intellectual Property Office, the disclosure of which is incorporated by reference herein in its entirety.

BACKGROUND

The present disclosure relates to micro light-emitting diode (micro-LED) packages and display modules including the same.

Light-emitting diodes (LEDs) are applied in a variety of industrial fields for their relatively high light-emitting efficiency and long lifespan, and are being commercialized in fields such as lightning displays.

Micro LEDs are next generation light-emitting devices that have higher efficiency than an LCD or an LED, and no additional filtering or conversion is necessary to directly emit a pure color from sub pixels, similar to an OLED. A display device employing micro LEDs may realize a large viewing angle, high efficiency, clear color, and high definition.

A display device may include a plurality of pixels, and each pixel may consist of three R/G/B sub pixels. A sub pixel is generally based on a blue LED, and includes phosphor formed over a light-emitting surface of the blue LED so as to emit a desired color (e.g., red, green) for each sub pixel. The LED that emits a blue color may use only the blue LED without phosphor.

One pixel may be manufactured as an LED package that includes a plurality of sub pixels. As described above, one LED package may consist of three R/G/B LEDs, and may be mounted on a TFT substrate to match a desired size and resolution. The LED package may be applied with an encapsulation process to protect a plurality of LEDs from oxygen in the air, moisture, external force, and the like.

In some instances, because metal wiring for electrically connecting an LED device with a top-emission structure is positioned over the light-emitting surface, there may be a disadvantage of light-emitting efficiency decreasing.

LED packages of related art may have complex structures. Because there are many steps involved in a manufacturing process and because of the complexity, it may cause an increase in unit cost and the decrease in manufacturing rate. In addition, the LED package of the related art may not be easily mass-producible because of LEDs being easily damageable, and there is a complicated problem of having to adjust many elements such as materials and a type of cathode, thickness, a method of encapsulation process, and the like when it is a top-emission type.

In addition, due to a characteristic of the LED package, the light-emitting device is exposed at an outermost side and the encapsulation process is essentially necessary to shield the light-emitting device from oxygen, moisture, and force. In this case, the encapsulation process may be composed of several complicated steps which is a factor in increasing the cost of the product.

SUMMARY

Example embodiments provide a light-emitting diode package.

According to an aspect of an example embodiment, a light-emitting diode package includes: a transparent layer; a plurality of light-emitting diodes disposed on a surface of the transparent layer, wherein each of the plurality of light-emitting diodes comprise a light-emitting surface that faces the transparent layer; a spacer disposed on the surface of the transparent layer; a protection member configured to cover the plurality of light-emitting diodes; and a plurality of light-emitting diode electrode pads comprising an electrode pad on each of the plurality of light-emitting diodes; wherein a first height from the surface of the transparent layer to an upper end of the spacer is larger than a second height from the surface of the transparent layer to the plurality of light-emitting diode electrode pads.

According to an aspect of an example embodiment, a light-emitting diode package includes: a transparent layer; a plurality of light-emitting diodes disposed on a surface of the transparent layer, wherein each of the plurality of light-emitting diodes comprise a light-emitting surface that faces the transparent layer and an electrode pad on a surface opposite the light-emitting surface; a protection member configured to cover the plurality of light-emitting diodes; and a spacer disposed on the surface of the transparent layer and configured to space the protection member apart from the transparent layer, wherein the spacer surrounds the plurality of light-emitting diodes.

According to an aspect of an example embodiment, a light-emitting diode package includes: a transparent layer; a plurality of light-emitting diodes disposed on a surface of the transparent layer, wherein each of the plurality of light-emitting diodes comprise a light-emitting surface that faces the transparent layer and a plurality of electrode pads comprising an electrode pad on each of the plurality of light-emitting diodes on a surface opposite the light-emitting surface; a protection member configured to cover the plurality of light-emitting diodes; and a spacer disposed the surface of the transparent layer and configured to space the protection member apart from the transparent layer, wherein the protection member is spaced apart from the plurality of electrode pads.

DETAILED DESCRIPTION

Figure 1A:
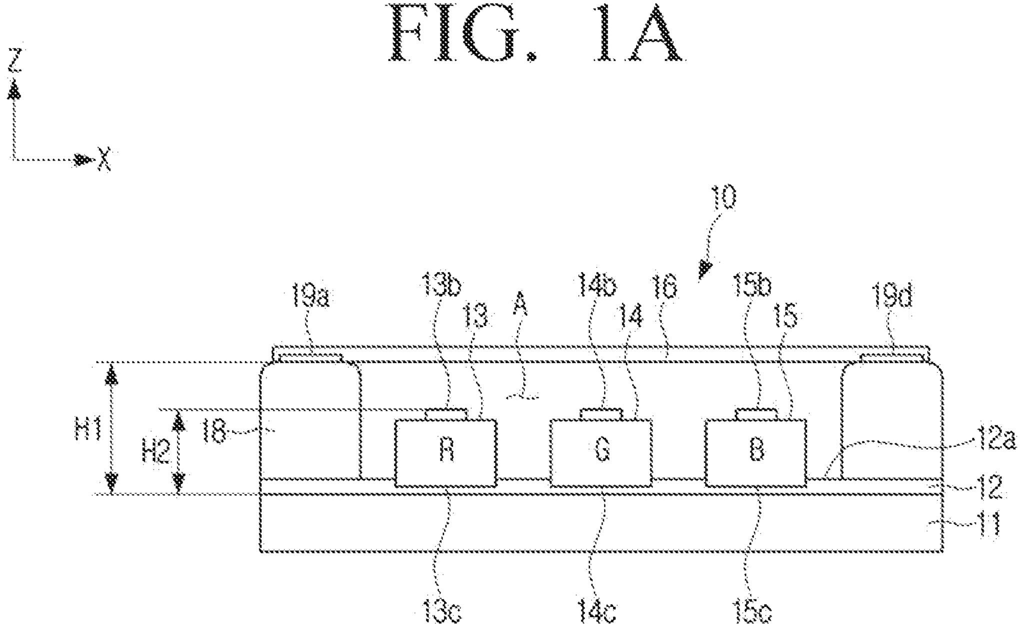
FIG. 1A is a view schematically illustrating an LED package according to an example embodiment of the disclosure.

Hereinafter, example embodiments will be described with reference to the accompanying drawings, in which example embodiments are shown. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In the example embodiments, it is to be understood that the terms such as "have" or "include" are used herein to designate a presence of a characteristic, number, step, operation, element, component, or a combination thereof, and not to preclude a presence or a possibility of adding one or more of other characteristics, numbers, steps, operations, elements, components or a combination thereof.

In the example embodiments, a glass substrate may be disposed with a TFT layer formed with a thin film transistor (TFT) circuit at a front surface thereof, and disposed with a driving circuit for driving the TFT circuit of the TFT layer at a back surface thereof. The glass substrate may be formed in a quadrangle shape. For example, the glass substrate may be formed in a rectangle shape or a square shape.

In the example embodiments, a glass substrate on which the TFT layer (or backplane) is stacked may be referred to as a TFT substrate. The TFT substrate is not limited to a specific structure or type. For example, the TFT substrate referred to in the example embodiments may be implemented as, for example, and without limitation, an Oxide TFT and a Si TFT (poly silicon, a-silicon), an organic TFT, a graphene TFT, and the like in addition to a Low Temperature Polycystalline Silicon (LTPS) TFT, and may produce only a P-type (or N-type) metal oxide semiconductor field effect transistor (MOSFET) in a Si wafer complementary metal oxide semiconductor (CMOS) process and apply the same.

In the example embodiments, a front surface of the glass substrate on which the TFT layer is disposed may be divided into an active area and a non-active area. The active area may correspond to an area occupied by the TFT layer at one surface of the glass substrate, and the non-active area may correspond to an edge area at one surface of the glass substrate. The edge area may include a side surface of the glass substrate. In addition, the edge area may be a remaining area excluding the area at which the TFT circuit is disposed at the front surface of the glass substrate and the area at which the driving circuit is disposed at the back surface of the glass substrate. In addition, the edge area may include the side surface of the glass substrate and a portion of the front surface of the glass substrate adjacent to the side surface thereof and a portion of the back surface of the glass substrate adjacent to the side surface thereof.

In the example embodiments, the glass substrate may be formed with a plurality of front surface connection pads which are electrically connected with the TFT circuit through wiring at the edge area of the front surface thereof, and a plurality of back surface connection pads which are electrically connected with the driving circuit through wiring at the edge area of the back surface thereof. The plurality of front surface connection pads and the plurality of back surface connection pads may be disposed such that each connection pad is inserted by a certain distance toward an inner side of the glass substrate from the side surface of the glass substrate. The connection pads formed at the front surface and the back surface of the glass substrate, respectively, may be electrically connected by side surface wiring that is formed at the edge area of the glass substrate.

In the example embodiment, a plurality of pixels may be provided at the TFT layer of the glass substrate. Each pixel may be one micro LED package including a plurality of sub pixels. One sub pixel may correspond to one micro LED. At the TFT layer, the TFT circuit for driving each pixel may be included.

In the example embodiment, the micro LED which is a sub pixel may be formed of an inorganic light-emitting matter having a size of less than or equal to 100 μm, and may be a semiconductor chip that can emit light on its own when power is supplied. Although an organic light-emitting diode (OLED) which is an organic light-emitting device and the micro LED which is an inorganic light-emitting device both have good energy efficiency, the micro LED has better brightness, light-emitting efficiency, and longer lifespan than the OLED. In addition, the micro LED may have a flip chip structure in which an anode electrode pad and a cathode electrode pad are formed at a same surface and the light-emitting surface is formed at an opposite side of the electrode pads. A display module provided with a plurality of micro LED packages may provide better contrast, faster response rate, and higher energy efficiency than a liquid crystal display (LCD) panel that requires a backlight.

In the example embodiment, the TFT layer formed stacked on the glass substrate may be electrically connected with the plurality of micro LED packages. Specifically, a package electrode pad of each micro LED package may be electrically connected to a TFT electrode pad on the TFT layer, and a package electrode of the micro LED package and the TFT electrode pad may have a bonding structure in a metallically bonded state.

In the example embodiments, the display module provided with the plurality of micro LED packages that is arrayed at a certain pitch may be a flat display panel.

In the example embodiments, the display module may form a black matrix in-between the plurality of micro LED packages arrayed on the TFT layer. The black matrix may enhance contrast ratio by not only absorbing external light, but also blocking light leaking from a peripheral part of the micro LED packages that are adjacent to one another.

In the example embodiments, the display module may be disposed with a touch screen at a side to which the plurality of micro LED packages emit light. In this case, the display module may include a touch screen driving part for driving a touch screen panel.

In the example embodiments, the display module may further include a rear substrate which is disposed at the back surface of the glass substrate and which is electrically connected through a flexible printed circuit (FPC) or the like, and the display module may further include a communication device for receiving data.

The display modules of example embodiments may be installed and applied to a wearable device, a portable device, a handheld device and various electronic products or electronic devices that require a display as a single unit, and applied to a display device such as a monitor for a personal computer (PC), a high resolution TV and signage (or, digital signage), electronic display, and the like, through a plurality of assembly arrangements including, for example, a matrix type arrangement.

An LED package according to an example embodiment will be described in detail below with reference to the drawings.

Figure 1B:
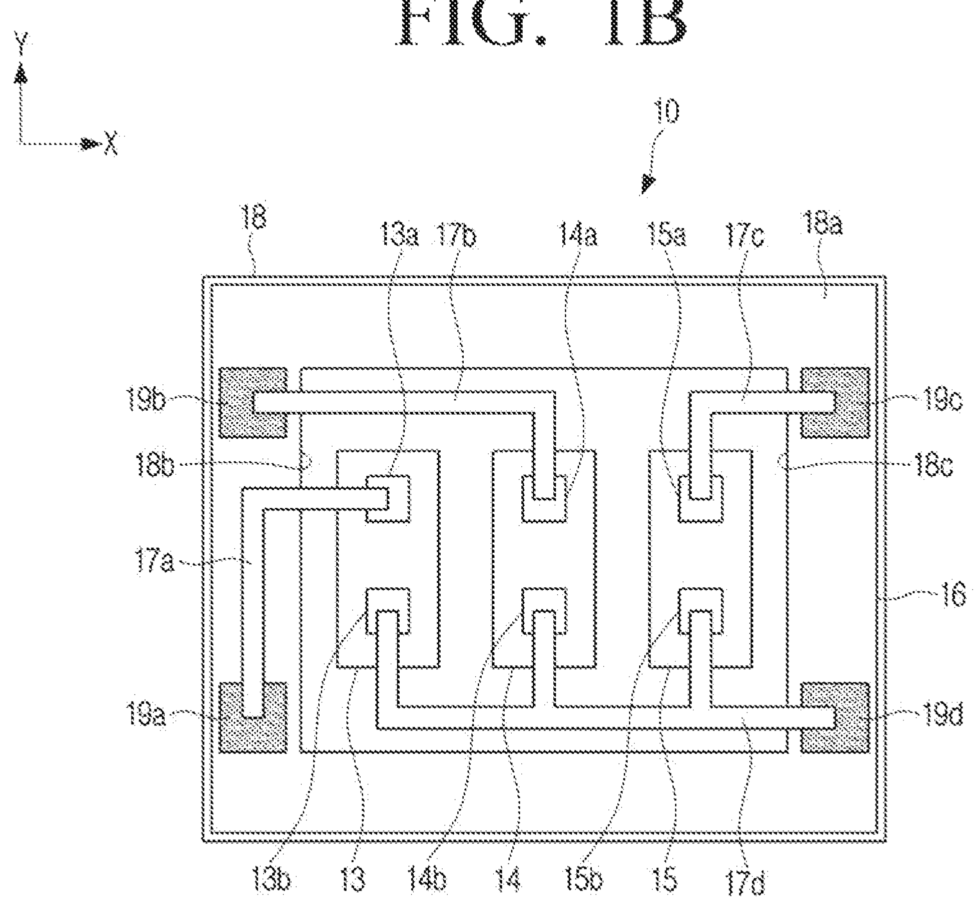
FIG. 1B is a plan view schematically illustrating the LED package according to an example embodiment of the disclosure shown in FIG. 1A.

FIG. 1A is a view schematically illustrating an LED package according to an example embodiment, and FIG. 1B is a plan view schematically illustrating the LED package according to an example embodiment shown in FIG. 1A.

Referring to FIG. 1A, an LED package 10 according to an example embodiment may include a transparent layer 11 that has a predetermined width, an adhesive layer 12 formed at one surface 11*a* of the transparent layer 11, a plurality of micro LEDs 13, 14, and 15 by which light-emitting surfaces 13*c*, 14*c*, and 15*c* are respectively attached to the adhesive layer 12, a spacer 18 that surrounds the plurality of micro LEDs, and a protection member 16 that prevents the plurality of micro LEDs from being exposed to air and moisture.

The transparent layer 11 may be fixed with the plurality of micro LEDs. The transparent layer may be formed of an insulating material having heat resistance, superior chemical resistance, and mechanical properties to protect the plurality of micro LEDs (e.g., a light-emitting surface portion of the micro LED). For example, the transparent layer may be a colorless polyimide (CPI).

The transparent layer 11 may have a transparency and thickness of an extent that it does not affect light being emitted from the plurality of micro LEDs 13, 14, and 15.

The transparent layer 11 may be formed in the rectangular shape or the square shape when viewed from a flat surface. However, the shape of the transparent layer 11 of the example embodiments are not limited thereto, and may be formed in various shapes.

The adhesive layer 12 may contact the light-emitting surfaces 13*c*, 14*c*, and 15*c* of the plurality of micro LEDs 13, 14, and 15 and attached the plurality of micro LEDs 13, 14, and 15 to the transparent layer 11. Accordingly, the plurality of micro LEDs 13, 14, and 15 may be disposed such that the light-emitting surfaces 13*c*, 14*c*, and 15*c* face one surface 11*a* of the transparent layer 11 and such that the such there is a certain distance between the transparent layer 11 and the light-emitting surfaces 13*c*, 14*c*, and 15*c*.

The adhesive layer 12 of the example embodiments may have a transparency of an extent that it does not affect light being emitted from the plurality of micro LEDs 13, 14, and 15, as with the transparent layer 11.

Although the plurality of micro LEDs has been described as being fixed to the transparent layer 11 by the adhesive layer 12, example embodiments are not limited thereto. In example embodiments, the plurality of micro LEDs can be directly attached to the transparent layer 11 when the transparent layer 11 is formed of a material having a predetermined strength and adhesive properties, and the adhesive layer 12 may be omitted.

The plurality of micro LEDs 13, 14, and 15 may emit colors different from one another. For example, the plurality of micro LEDs may be a red micro LED 13, a green micro LED 14, and a blue micro LED 15. The plurality of micro LEDs 13, 14, and 15 may have a flip chip structure in which an anode electrode pad and a cathode electrode pad are formed at a same surface and the light-emitting surface is formed at an opposite side of the electrode pads.

In the example embodiment, three micro LEDs 13, 14, and 15 may correspond to three sub pixels. The plurality of sub pixels may form one pixel. Accordingly, one micro LED package may include one pixel.

Although the plurality of sub pixels being formed of three micro LEDs corresponding to red/green/blue (R/G/B) colors have been described as an example, example embodiments are not limited thereto. For example, the plurality of sub pixels may be formed of two micro LEDs of red/blue (RB) colors, red/green (R/G) colors, or green/blue (G/B) colors, formed of three micro LEDs of red/blue/white (R/B/W) colors, formed of four micro LEDs of red/green/blue/white (R/G/B/W), red/green/green/white (R/G/G/W) colors, or red/green/blue/yellow (R/G/B/Y) colors, or formed of five micro LEDs of red/green/blue/yellow/cyan (R/G/B/Y/C) colors. In this case, a number of pixel circuits may correspond to a number of sub pixels.

Referring to FIG. 1B, the three micro LEDs 13, 14, and 15 may respectively include a pair of micro LED electrode pads at opposite surfaces of the light-emitting surfaces 13*c*, 14*c*, and 15*c*. For example, the red micro LED 13 may include a first anode electrode pad 13*a* and a first cathode electrode pad 13*b*, the green micro LED 14 may include a second anode electrode pad 14*a* and a second cathode electrode pad 14*b*, and the blue micro LED 15 may include a third anode electrode pad 15*a* and a third cathode electrode pad 15*b*.

The first to third anode electrode pads 13*a*, 14*a*, and 15*a* may be electrically connected to the corresponding first to third package electrode pads 19*a*, 19*b*, and 19*c* respectively through the first to third wirings 17*a*, 17*b*, and 17*c*. The first to third package electrode pads 19*a*, 19*b*, and 19*c* may be electrically connected to a driving voltage (VDD).

The first to third wirings 17*a*, 17*b*, and 17*c* may have a predetermined thickness, and may be formed at a surface of respective micro LEDs 13, 14, and 15, at one surface of the transparent layer 11 (or one surface of the adhesive layer 12), and along a surface of a spacer 18.

The first to third cathode electrode pads 13*b*, 14*b*, and 15*b* may be electrically connected to a fourth package electrode pad 19*d* that corresponds to a common electrode through a fourth wiring 17*d*. A fourth package electrode pad 19*d* may be electrically connected to a ground voltage (VCC).

In this case, the fourth wiring 17*d* may have a predetermined thickness, and may be formed at the surfaces of the respective micro LEDs 13, 14, and 15, at one surface of the transparent layer 11 (or one surface of the adhesive layer 12), and along the surface of the spacer 18.

Figure 2:
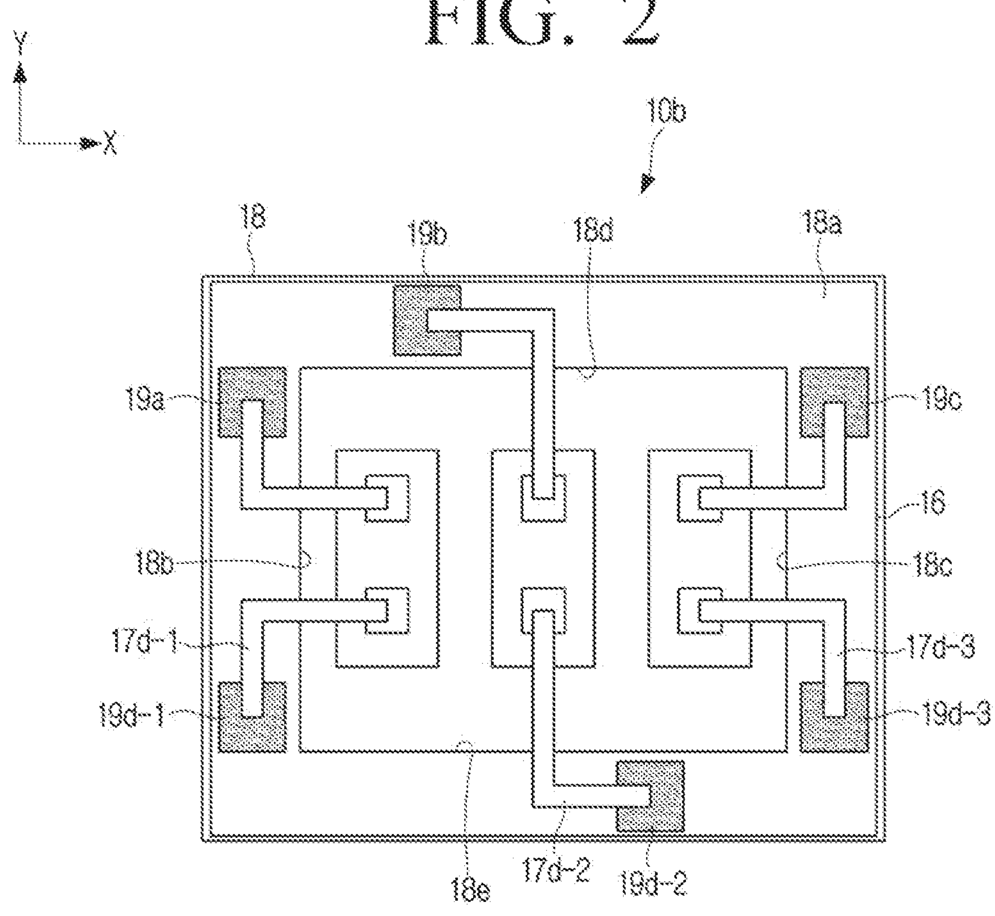
FIG. 2 is a plan view illustrating an electrode array of an LED package according to another example embodiment of the disclosure.

Referring to FIG. 2, it may be possible for each of the first to third cathode electrode pads 13*b*, 14*b*, and 15*b* to be electrically connected to respectively corresponding fifth to seventh package electrode pads 19*d*-1, 19*d*-2, and 19*d*-3 through separate fifth to seventh wirings 17*d*-1, 17*d*-2, and 17*d*-3, respectively. The fifth to seventh package electrode pads 19*d*-1, 19*d*-2, and 19*d*-3 may be electrically connected to the ground voltage (VCC), respectively.

The fifth to seventh wirings 17*d*-1, 17*d*-2, and 17*d*-3 may have a predetermined thickness, and may be formed at the surfaces of the respective micro LEDs 13, 14, and 15, at one surface of the transparent layer 11 (or one surface of the adhesive layer 12), and along the surface of the spacer 18.

The wiring that connects the electrode pad of each micro LED with the corresponding package electrode pad may be formed through, for example, a photo resist process and an etch process.

Referring to FIG. 1A and FIG. 1B, the spacer 18 for protecting the plurality of micro LEDs 13, 14, and 15 from external impact may be formed at one surface 11*a* of the transparent layer 11.

The spacer 18 may surround the plurality of micro LEDs 13, 14, and 15 in a closed loop shape along an outer edge of the transparent layer 11. In this case, the spacer 18 of the example embodiments may have a width of an extent it can withstand external impact. The spacer 18 may be patterned and formed on the transparent layer 11.

The spacer 18 may be configured such that a height H1 of the spacer 18 is formed higher than a height H2 of the respective micro LEDs 13, 14, and 15 so as to protect each micro LED from impact that is applied from an upper side of the respective micro LEDs 13, 14, and 15. Here, the height H1 of the spacer 18 and the height H2 of the respective micro LEDs 13, 14, and 15 may be compared based on a same surface, for example, one surface of the transparent layer 11 that faces the light-emitting surface of the respective micro LEDs 13, 14, and 15 as shown in FIG. 1. In this case, the height H2 of the respective micro LEDs 13, 14, and 15 may be defined as from the one surface of the transparent layer 11 to the opposite surface of the light-emitting surface. Alternatively, the height H2 of the respective micro LEDs 13, 14, and 15 may be defined as from the one surface of the transparent layer 11 to a top surface of the electrode pads 13*a*, 14*a*, 15*a*, 13*b*, 14*b*, 15*b*.

The spacer 18 may be configured such that one side surface corresponds to the outer edge of the transparent layer 11 and other side surface of the spacer 18 is spaced apart from an adjacent micro LED by a predetermined distance. As described above, the distance between the one side surface and the other side surface of the spacer 18 may be defined by the width of the spacer 18.

In addition, in example embodiments, the spacer 18 may be formed with a width that is of an extent that the one surface of the spacer 18 corresponds to the outer edge of the transparent layer 11 and the other side surface of the spacer 18 is in close contact with the adjacent micro LED.

The spacer 18 may be formed of an organic matter having a predetermined hardness. In addition, it may also be possible for the spacer 18 to be formed of an insulating matter.

The protection member 16 may be formed as a film of a predetermined thickness that covers the plurality of micro LEDs 13 14, and 15. The protection member 16 may be spaced apart from an upper end of the plurality of micro LEDs 13 14, and 15 and the electrode pads 13*a*, 14*a*, 15*a*, 13*b*, 14*b*, 15*b* by a predetermined distance.

The protection member 16 may be coupled to and contact the top surface of the spacer 18. Accordingly, a space A disposed with the plurality of micro LEDs 13, 14, and 15 which is surrounded by the spacer 18 may be at least somewhat sealed.

The micro LED package 10 of the example embodiment may prevent the plurality of micro LEDs from being exposed to oxygen included in the air and moisture through the protection member 16 and obtain an encapsulation effect protecting from an external impact.

When the protection member 16 covers the top surface of the spacer 18, the plurality of package electrode pads 19*a*, 19*b*, 19*c*, and 19*d* may also be covered.

When transferring the plurality of micro LED packages 10 to the TFT substrate, the plurality of package electrode pads 19*a*, 19*b*, 19*c*, and 19*d* may respectively be electrically connected with the TFT electrode pad of the TFT substrate.

To this end, the protection member 16 may be formed of an anisotropic conductive film (ACF). The anisotropic conductive film may be, for example, formed as a double-sided tape in which an adhesive that is hardened by heat is mixed with a fine conductive ball or balls.

If the plurality of micro LED packages are transferred to the TFT substrate by applying pressure and a high temperature, the conductive ball or balls positioned between the plurality of package electrode pads 19*a*, 19*b*, 19*c*, and 19*d* and the TFT electrode pad may be destroyed and electricity may be conducted between the pads and the pads may be adhered to each other.

Figure 3:
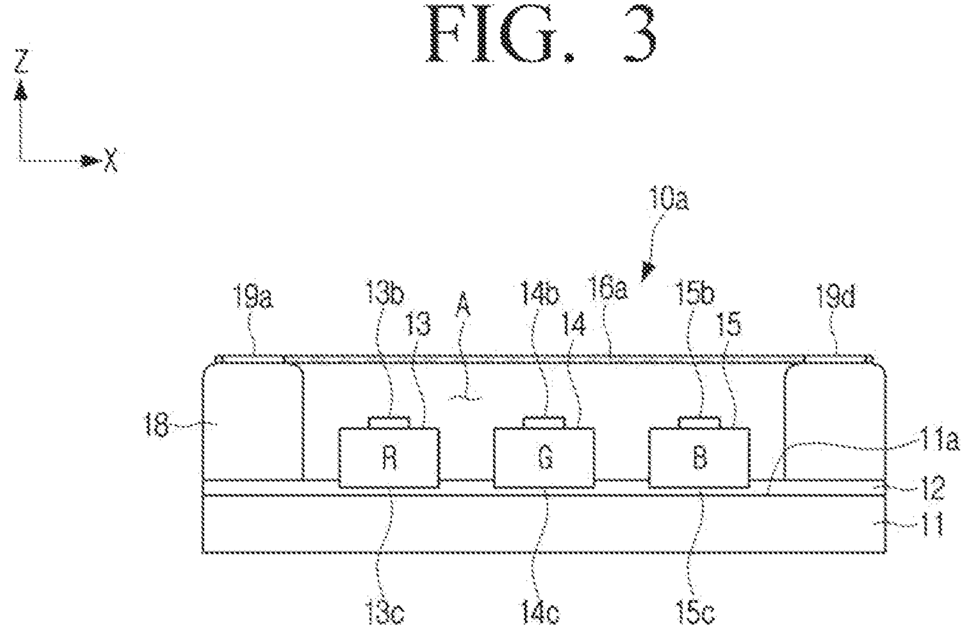
FIG. 3 is a view illustrating an example in which a protection member of an LED package is formed of a non-conductive film according to an example embodiment of the disclosure.

Referring to an example embodiment shown in FIG. 3, a micro LED package 10*a* may be configured such that a protection member 16*a* is formed as a non-conductive film. The protection member 16*a* may, for example, form a hole at positions corresponding to the respective package electrode pads 19*a*, 19*b*, 19*c*, and 19*d* such that the plurality of package electrode pads 19*a*, 19*b*, 19*c*, and 19*d* are not covered by the protection member 16*a* and are instead exposed.

The protection members 16 and 16*a* of the example embodiments may not necessarily be limited to a film shape.

Figure 4:
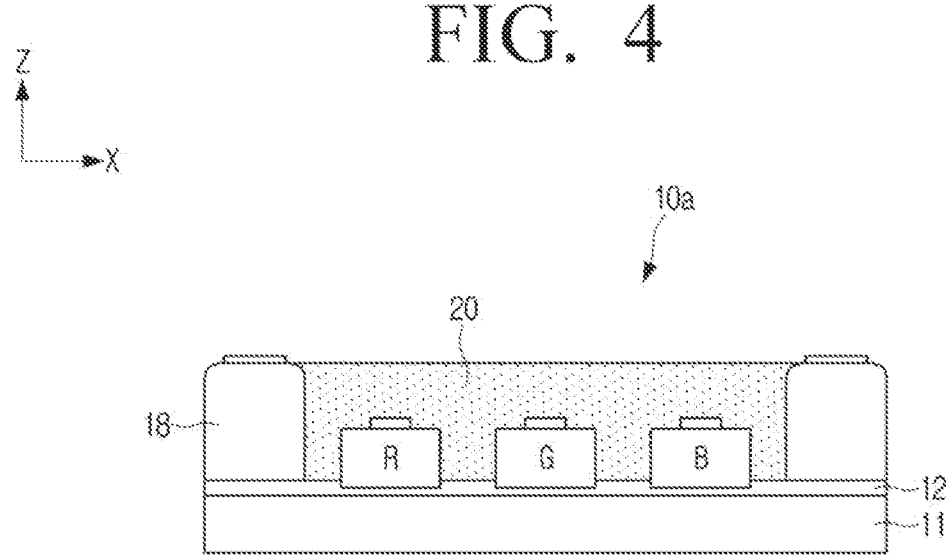
FIG. 4 is a view illustrating an example in which an insulation member is filled in a space surrounded by a spacer of a closed loop shape in an LED package according to an example embodiment of the disclosure.

Referring to FIG. 4, a micro LED package 10*b* may be configured such that a protection member 20 is formed of an insulating matter which is filled in a space surrounded by the spacer 18. The protection member 20 may have a predetermined hardness undergoing a curing process after being filled in the space surrounded by the spacer 18 in, for example, a liquid or gel state of high fluidity.

If the protection member 20 is a material that is not fully curable, the above-described protection members 16 and 16*a* in the film shape may be added and the protection member 20 in the gel state may be covered by, for example, one of the above-described protection members 16 and 16*a*.

Figure 5:
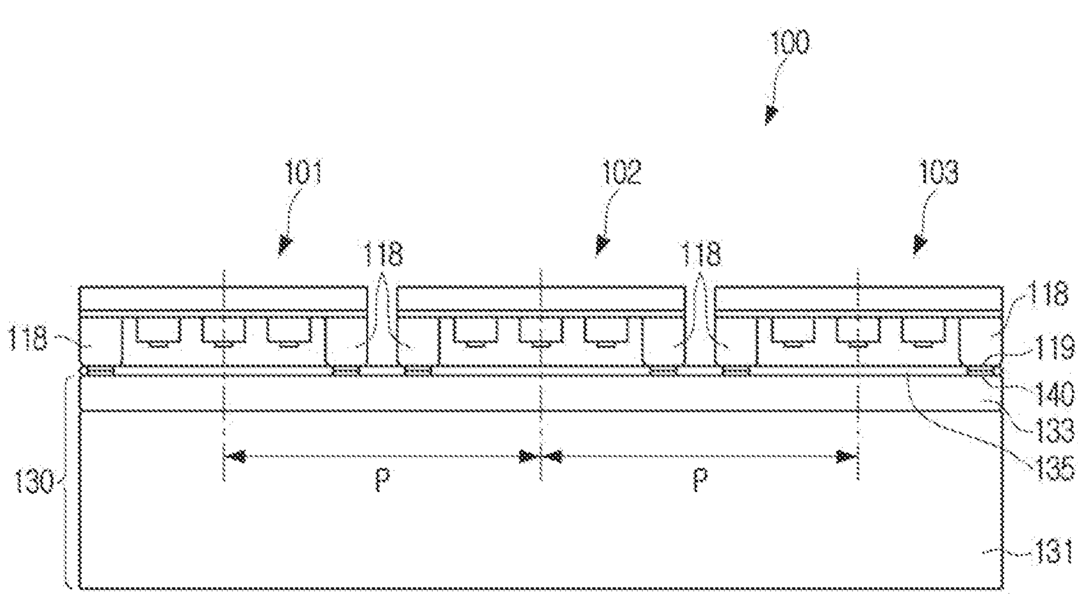
FIG. 5 is a view illustrating an example of a display module arrayed with a plurality of LED packages on a TFT substrate according to an example embodiment of the disclosure.

FIG. 5 is a view illustrating an example of a display module arrayed with a plurality of LED packages on a TFT substrate according to an example embodiment.

A display module 100 according to an example embodiment may include a TFT substrate 130, and a plurality of micro LED packages 101, 102, and 103 arrayed on the TFT substrate 130 at a certain pitch P. In example embodiments, the micro LED packages 10 or 10*a* described above or micro LED package 200 described below may be used as the micro LED packages 101, 102 and 103 or individual parts or features of the micro LED packages 10, 10*a*, 200 may be used in the micro LED packages 101, 102 and 103. In other example embodiments other micro LED packages or features may be used.

The TFT substrate 130 may include a glass substrate 131, and a TFT layer 133 formed on the glass substrate 131.

The glass substrate 131 may have a predetermined thickness. In the example embodiment, a direction in which light is emitted from the plurality of micro LED packages 101, 102, and 103 may be formed in an opposite direction of the glass substrate 131. Accordingly, it may also be possible to use a substrate which has lower transparency or is of an opaque material in place of the glass substrate 131.

The TFT layer 133 may be formed at a front surface of the glass substrate 131 and formed to a multi-layer structure. In an example embodiment, the TFT layer 133 may include a buffer layer stacked on the front surface of the glass substrate 131, a gate insulating layer stacked on the buffer layer, an interlayer insulating layer stacked on the gate insulating layer, and a plurality of passivation layers stacked sequentially on the interlayer insulating layer. In addition, the TFT layer 133 may include wiring which is electrically connected to a voltage terminal (VDD, VSS).

The TFT layer 133 may include a plurality of TFT electrode pads 140 which are electrically connected with the wiring. The TFT layer 133 may be formed with an adhesive layer 135 that covers the plurality of TFT electrode pads 140.

The adhesive layer 135 may include a fine conductive ball or balls which allows for each TFT electrode pad 140 and a package electrode pad 119 of the micro LED package corresponding thereto to interconnect physically and electrically.

If, for example, a spacer 118 provided in the micro LED packages 101, 102, and 103 is opaque, the spacer 118 in the micro LED packages 101, 102, and 103 may perform the role of the black matrix by blocking light from leaking from the peripheral part of the micro LED packages adjacent to one another and enhancing contrast ratio by absorbing external light. In the example embodiment, a separate black matrix arrayed on the TFT substrate 130 may not be formed, as shown in FIG. 5, though the example embodiment is not limited thereto.

Figure 6:
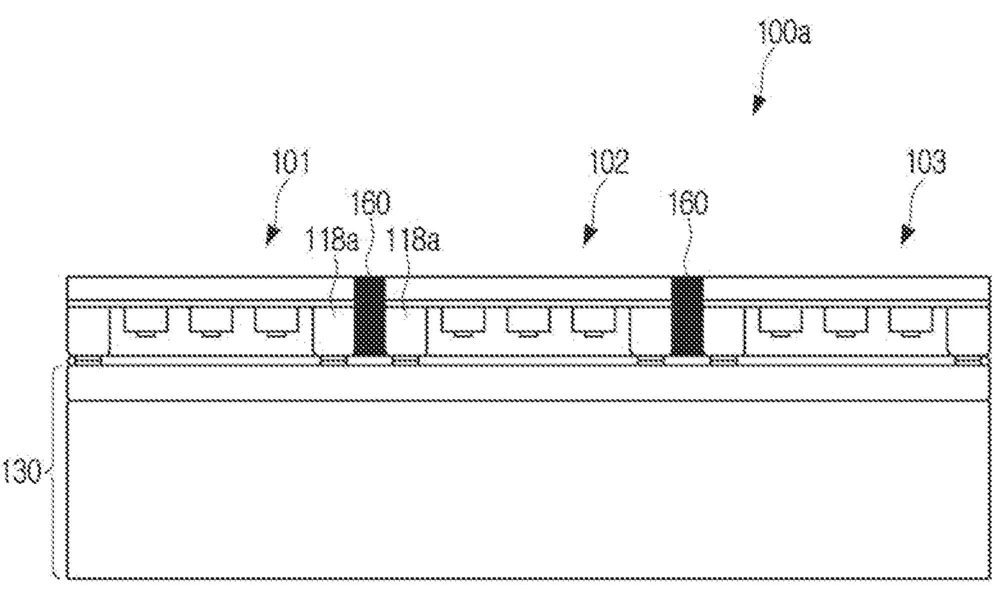
FIG. 6 is a view illustrating another example of a display module arrayed with a plurality of LED packages on a TFT substrate according to an example embodiment of the disclosure.

FIG. 6 is a view illustrating another example of a display module arrayed with a plurality of LED packages on a TFT substrate according to an example embodiment.

Alternatively, if a spacer 118*a* provided in the micro LED packages 101, 102, and 103 is transparent, as shown in FIG. 6, a black matrix 160 may be formed in between the plurality of micro packages 101, 102, and 103, though the example embodiment is not limited thereto.

Figure 7:
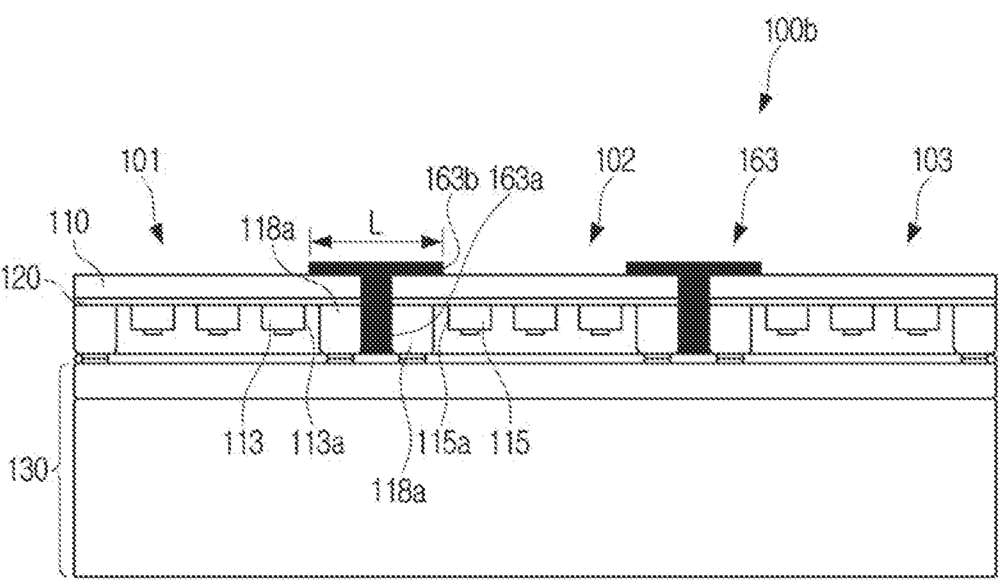
FIG. 7 is a view illustrating still another example of a display module arrayed with a plurality of LED packages on a TFT substrate according to an example embodiment of the disclosure.

FIG. 7 is a view illustrating still another example of a display module arrayed with a plurality of LED packages on a TFT substrate according to an example embodiment.

In addition, referring to FIG. 7, if the spacer 118*a* provided in the micro LED packages 101, 102, and 103 is transparent, a black matrix 163*a* may extend and form an extending part 163*b* that covers a portion of other surface (surface formed with the adhesive layer 120 is the opposite surface) of the transparent layer 110, though the example embodiment is not limited thereto.

The extending part 163*b* may be formed to a position that corresponds to outer side surfaces 113*a* and 115*a* of the micro LEDs 113 and 115 disposed at an outermost side of the micro LED packages 101 and 102 adjacent to each other.

Figure 8:
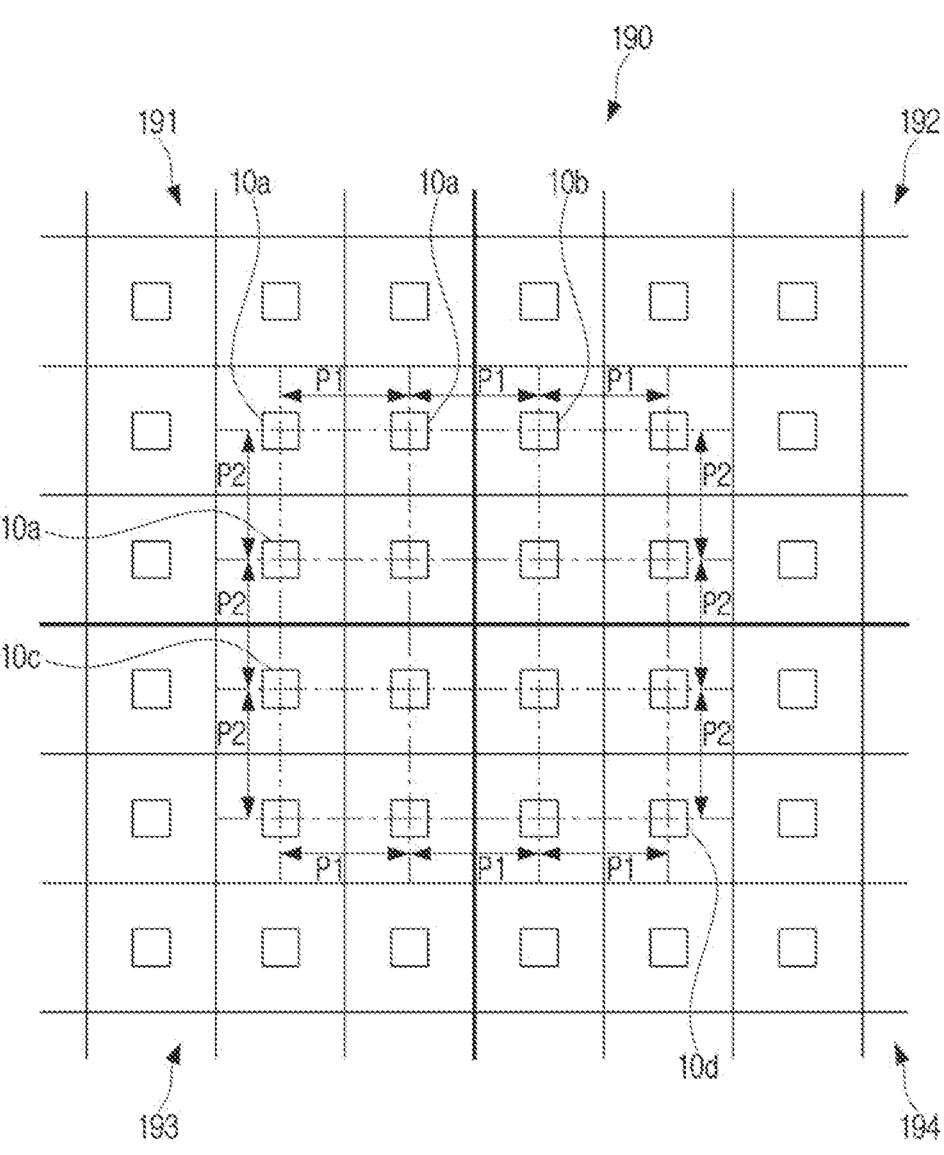
FIG. 8 is a view illustrating an example of a display device connected with a plurality of display modules according to an example embodiment of the disclosure.

FIG. 8 is a view illustrating an example of a display device connected with a plurality of display modules according to an example embodiment.

Referring to FIG. 8, a plurality of display modules 191, 192, 193, and 194 according to an example embodiment may be arrayed adjacent to one another to form a large scale display device 190.

A plurality of micro LED packages 10*a*, 10*b*, 10*c*, and 10*d* provided in the respective display modules 191, 192, 193, and 194 may be arrayed in a row direction at a first pitch P1, and arrayed in a column direction at a second pitch P2.

In addition, the respective display modules 191 and 192, and 193 and 194 disposed adjacently to one another in a row may be arrayed such that an inter-row pitch between the micro LED packages disposed at the outermost edge is at the first pitch P1. In addition, the respective display modules 191 and 193, and 192 and 194 disposed adjacently to one another in a column may be arrayed such that an inter-column pitch between the micro LED packages disposed at the outermost edge is at the second pitch P2.

Accordingly, the display device 190 which connected the display modules 191, 192, 193, and 194 according to example embodiments may enhance display quality by blocking a seam from appearing in-between the display modules adjacent to one another.

Figure 9A:
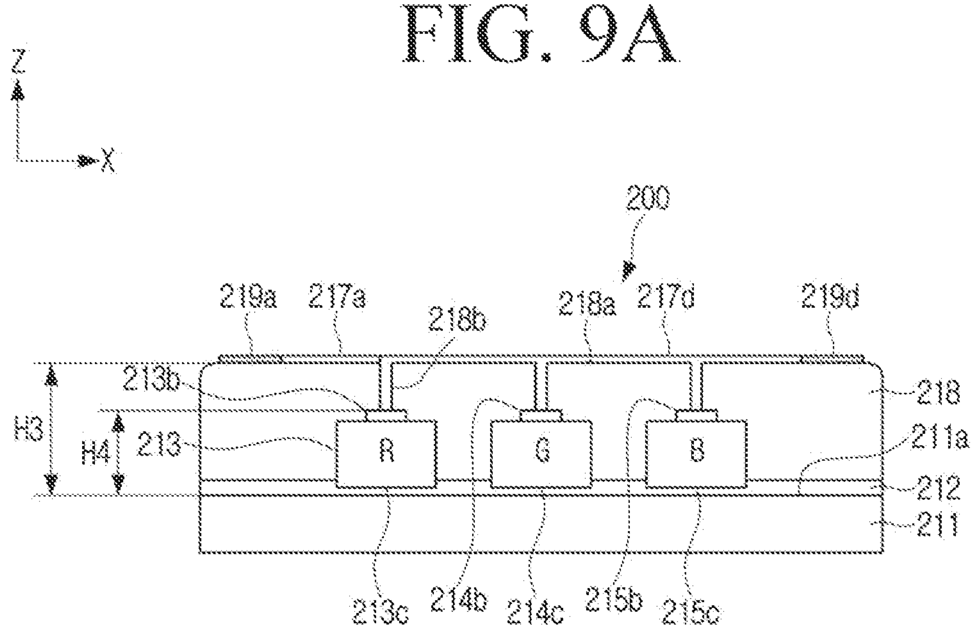
FIG. 9A is a view schematically illustrating an LED package according to another example embodiment of the disclosure.
Figure 9B:
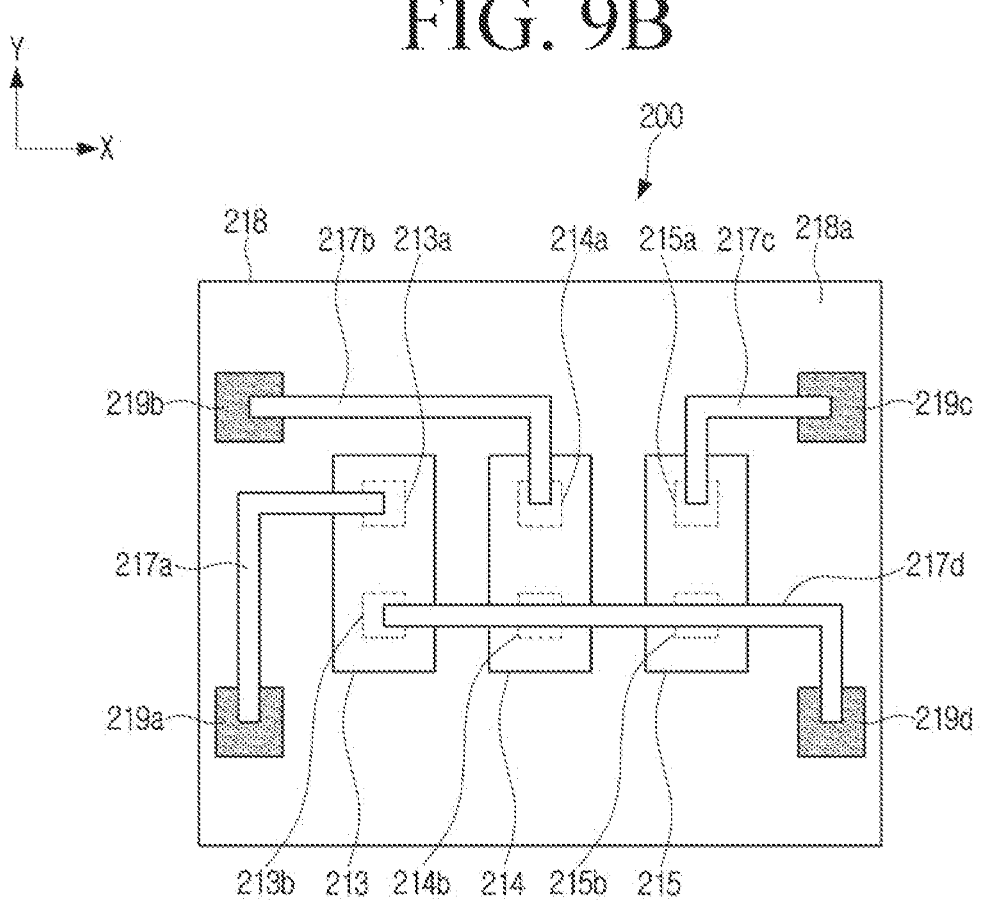
FIG. 9B is a plan view schematically illustrating the LED package according to another example embodiment of the disclosure shown in FIG. 9A.

FIG. 9A is a view schematically illustrating an LED package according to another example embodiment, and FIG. 9B is a plan view schematically illustrating the LED package according to another example embodiment shown in FIG. 9A.

Referring to FIG. 9A, an LED package 200 according to another example embodiment may include a transparent layer 211 having a predetermined width, an adhesive layer 212 formed at one surface 211*a* of the transparent layer 211, a plurality of micro LEDs 213, 214, and 215 in which light-emitting surfaces 213*c*, 214*c*, and 215*c* are respectively attached to the adhesive layer 212, and a spacer 218 that covers the plurality of micro LEDs.

The transparent layer 211 may be formed of an insulating material having heat resistance, superior chemical resistance, and mechanical properties. For example, the transparent layer may be a colorless polyimide (CP).

The transparent layer 211 may have a transparency and thickness of an extent that does not affect light being emitted from the plurality of micro LEDs 213, 214, and 215.

The transparent layer 211 may be formed in the rectangular shape or the square shape when viewed from a flat surface. However, the shape of the transparent layer 211 is not limited thereto, and may be formed in various shapes.

The adhesive layer 212 may be attached with the light-emitting surfaces 213*c*, 214*c*, and 215*c* of the plurality of micro LEDs 213, 214, and 215. Accordingly, the plurality of micro LEDs 213, 214, and 215 may be disposed such that the light-emitting surfaces 213*c*, 214*c*, and 215*c* face the one surface 211*a* of the transparent layer 211 and disposed at the transparent layer 211 with a certain distance therebetween.

The adhesive layer 212 may have a transparency of an extent that does not affect light being emitted from the plurality of micro LEDs 213, 214, and 215 as with the transparent layer 211.

The plurality of micro LEDs 213, 214, and 215 may emit colors different from one another, and as sub pixels, may form one pixel. As described above, although an example of the plurality of sub pixels being formed as three micro LEDs corresponding to red/green/blue (R/G/B) colors has been provided, the example embodiment is not limited thereto.

The spacer 218 for protecting the plurality of micro LEDs 213, 214, and 215 from an external impact may be formed at the one surface 211*a* of the transparent layer 211.

The spacer 218 may be formed to cover the plurality of micro LEDs 213, 214, and 215 as shown in FIG. 9A. The spacer 218 may be formed to cover both the side surface and the top surface of each micro LED to shield from impact that is applied from a side direction or an upper direction of the respective micro LEDs 213, 214, and 215. It may be preferable for a height H3 of the spacer 218 to be formed higher than a height H4 of the respective micro LEDs 213, 214, and 215. Here, the height H3 of the spacer 218 and the height H4 of the respective micro LEDs 213, 214, and 215 may be compared based on a same surface, for example, the one surface 211*a* of the transparent layer 211 that faces the light-emitting surface of the respective micro LEDs 213, 214, and 215 as shown in FIG. 9A.

The spacer 218 may be formed of an organic matter. In addition, the spacer 218 may also be formed of an insulating matter.

The micro LED package 200 described above may obtain an encapsulation effect of protecting each micro LED from oxygen in the air, moisture, external impact, and the like, when the spacer 218 is formed to cover both the side surface and the top surface of each micro LED.

Referring to FIG. 9B, the three micro LEDs 213, 214, and 215 may each include a pair of electrode pads at opposite surfaces of the light-emitting surfaces 213*c*, 214*c*, and 215*c*. For example, a red micro LED 213 may include a first anode electrode pad 213*a* and a first cathode electrode pad 213*b*, a green micro LED 214 may include a second anode electrode pad 214*a* and a second cathode electrode pad 214*b*, and a blue micro LED 215 may include a third anode electrode pad 215*a* and a third cathode electrode pad 215*b*.

The first to third anode electrode pads 213*a*, 214*a*, and 215*a* may be electrically connected to corresponding first to third package electrode pads 219*a*, 219*b*, and 219*c* respectively through first to third wirings 217*a*, 217*b*, and 217*c*. The first to third package electrode pads 219*a*, 219*b*, and 219*c* may be electrically connected to the driving voltage (VDD).

The first to third wirings 217*a*, 217*b*, and 217*c* may have a predetermined thickness, and may be formed at a via hole 218*b* formed at the spacer 218 and along a top surface 218*a* of the spacer 218.

The first to third cathode electrode pads 213*b*, 214*b*, and 215*b* may be electrically connected to a fourth package electrode pad 219*d* that corresponds to a common electrode through a fourth wiring 217*d*. A fourth package electrode pad 219*d* may be electrically connected to the ground voltage (VCC).

In this case, the fourth wiring 217*d* may have a predetermined thickness, and may be formed at the via hole 218*b* formed at the spacer 218 and along the top surface 218*a* of the spacer 218.

While example embodiments have been particularly shown and described, it will be understood that various changes in form and details may be made without departing from the spirit and scope of the following claims.

What is claimed is:

1. A light-emitting diode package, comprising:

a transparent layer;

a plurality of light-emitting diodes disposed on a surface of the transparent layer, wherein each of the plurality of light-emitting diodes comprise a light-emitting surface that faces the transparent layer;

a spacer disposed on the surface of the transparent layer;

a protection member configured to cover the plurality of light-emitting diodes; and a plurality of light-emitting diode electrode pads comprising an electrode pad on each of the plurality of light-emitting diodes;

wherein a first height from the surface of the transparent layer to an upper end of the spacer is larger than a second height from the surface of the transparent layer to the plurality of light-emitting diode electrode pads, wherein the spacer includes a space that is defined by at least a first side surface of the spacer and a second side surface of the spacer that faces the first side surface, and wherein the plurality of light-emitting diodes are in the space of the spacer.

2. The light-emitting diode package of claim 1, wherein the spacer comprises an organic matter.

3. The light-emitting diode package of claim 1, wherein the spacer comprises a closed loop shape that surrounds the plurality of light-emitting diodes.

4. The light-emitting diode package of claim 3, wherein the spacer is formed along an outer edge of the transparent layer.

5. The light-emitting diode package of claim 3, further comprising a plurality of package electrode pads disposed at the upper end of the spacer; and wherein the plurality of package electrode pads are electrically connected with the plurality of light-emitting diode electrode pads through a plurality of wirings.

6. The light-emitting diode package of claim 5, wherein the plurality of wirings are disposed at a surface of the plurality of light-emitting diodes, at the surface of the transparent layer, and along a surface of the spacer.

7. The light-emitting diode package of claim 1, wherein the protection member comprises a film that covers the plurality of light-emitting diodes and wherein the protection member is spaced apart from an upper end of the plurality of light-emitting diodes.

8. The light-emitting diode package of claim 7, further comprising a plurality of package electrode pads disposed at the upper end of the spacer;

wherein the protection member comprises an anisotropic conductive film, and wherein the plurality of package electrode pads are covered by the protection member.

9. The light-emitting diode package of claim 7, further comprising a plurality of package electrode pads disposed at the upper end of the spacer;

wherein the protection member comprises a non-conductive film, and wherein the plurality of package electrode pads are not covered by the protection member.

10. The light-emitting diode package of claim 1, further comprising an insulating member;

wherein the insulating member is disposed in a space formed by the spacer and wherein the insulating member covers the plurality of light-emitting diodes.

11. The light-emitting diode package of claim 1, further comprising an adhesive layer formed on the surface of the transparent layer, and wherein the adhesive layer attaches the plurality of light-emitting diodes to the transparent layer.

12. The light-emitting diode package of claim 1, wherein the plurality of light-emitting diodes comprise a flip chip structure in which the plurality of light-emitting diode electrode pads comprises a pair of electrode pads on each of the plurality of light-emitting diodes on a surface opposite of the light-emitting surface.

13. The light-emitting diode package of claim 1, wherein the spacer further comprises a third side surface that corresponds to an outer edge of the transparent layer, and wherein the first side surface faces in a direction opposite of a facing direction of the third side surface.

14. The light-emitting diode package of claim 1, wherein the first side surface or the second side surface is in contact with one of the plurality of light-emitting diodes.

15. The light-emitting diode package of claim 1, wherein the spacer is configured to cover the plurality of light-emitting diodes.

16. The light-emitting diode package of claim 1, wherein the spacer comprises an insulating material, and wherein the light-emitting diode package further comprises a plurality of package electrode pads on an upper end of the spacer.

17. A light-emitting diode package, comprising:

a transparent layer;

a plurality of light-emitting diodes disposed on a surface of the transparent layer, wherein each of the plurality of light-emitting diodes comprise a light-emitting surface that faces the transparent layer and an electrode pad on a surface opposite the light-emitting surface;

a protection member configured to cover the plurality of light-emitting diodes; and a spacer disposed on the surface of the transparent layer and configured to space the protection member apart from the transparent layer, wherein the spacer surrounds the plurality of light-emitting diodes, wherein the spacer includes a space that is defined by at least a first side surface of the spacer and a second side surface of the spacer that faces the first side surface, and wherein the plurality of light-emitting diodes are in the space of the spacer.

18. The light-emitting diode package of claim 17, further comprising an insulating member disposed in a space between the transparent layer and the protection member.

19. The light-emitting diode package of claim 18, wherein the spacer comprises an organic matter;

wherein the spacer is formed along an outer edge of the transparent layer, and wherein the spacer comprises a closed loop.

* * * * *